United States Patent
Honda et al.

(10) Patent No.: US 7,820,557 B2
(45) Date of Patent: Oct. 26, 2010

(54) METHOD FOR NITRIDING SUBSTRATE AND METHOD FOR FORMING INSULATING FILM

(75) Inventors: Minoru Honda, Amagasaki (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 364 days.

(21) Appl. No.: 11/910,354

(22) PCT Filed: Mar. 28, 2006

(86) PCT No.: PCT/JP2006/306277

§ 371 (c)(1),
(2), (4) Date: Oct. 1, 2007

(87) PCT Pub. No.: WO2006/106665

PCT Pub. Date: Oct. 12, 2006

(65) Prior Publication Data
US 2009/0269940 A1    Oct. 29, 2009

(30) Foreign Application Priority Data
Mar. 31, 2005    (JP) .............................. 2005-103655

(51) Int. Cl.
*H01L 21/318* (2006.01)

(52) U.S. Cl. .............................. 438/775; 257/E21.292; 118/723 R

(58) Field of Classification Search ......... 438/772–777; 257/E21.292; 118/723 R
See application file for complete search history.

(56) References Cited

U.S. PATENT DOCUMENTS

| 7,159,599 B2* | 1/2007 | Verhaverbeke et al. ...... 134/109 |
| 2003/0082835 A1* | 5/2003 | McChesney et al. .......... 438/10 |
| 2004/0121539 A1* | 6/2004 | Omi et al. ................... 438/257 |
| 2004/0134618 A1* | 7/2004 | Endoh et al. ............ 156/345.51 |
| 2004/0142577 A1* | 7/2004 | Sugawara et al. ............ 438/772 |
| 2005/0205013 A1* | 9/2005 | Nakanishi et al. ..... 118/723 AN |
| 2008/0214017 A1* | 9/2008 | Murakawa et al. .......... 438/778 |

FOREIGN PATENT DOCUMENTS

| WO | 02 058130 | 7/2002 |
| WO | 2004 047157 | 6/2004 |
| WO | WO 2004047157 A1 * | 6/2004 |

* cited by examiner

*Primary Examiner*—W. David Coleman
*Assistant Examiner*—Christine Enad
(74) *Attorney, Agent, or Firm*—Oblon, Spivak, McClelland, Maier & Neustadt, L.L.P.

(57) ABSTRACT

In a substrate nitriding method for nitriding a target substrate by allowing a nitrogen-containing plasma to act on silicon on a surface of the substrate in a processing chamber of a plasma processing apparatus, the nitridation by the nitrogen-containing plasma is performed by controlling a sheath voltage $V_{dc}$ around the substrate to be less than or equal to about 3.5 eV. The sheath voltage $V_{dc}$ is a potential difference $V_p - V_f$ between a plasma potential $V_p$ in a plasma generating region and a floating potential $V_f$ of the substrate.

22 Claims, 13 Drawing Sheets

METHOD FOR NITRIDING SUBSTRATE AND METHOD FOR FORMING INSULATING FILM

FIELD OF THE INVENTION

The present invention relates to a substrate nitriding method and an insulating film forming method for processing a target substrate such as a semiconductor wafer by using a plasma to thereby form a silicon nitride film on the target substrate.

BACKGROUND OF THE INVENTION

In a manufacturing process of various semiconductor devices, a silicon nitride film is formed as a gate insulating film of, e.g., a transistor. As a method for forming the silicon nitride film, there is proposed, e.g., a method for forming a silicon oxynitride film by introducing nitrogen into a silicon oxide film by a plasma process, in addition to a method for depositing a silicon nitride film by CVD (Chemical Vapor Deposition) (see, for example, Reference 1).

Meanwhile, with the recent trend of miniaturization of semiconductor devices, a gate insulating film is getting thinner, and it is required to form a thin gate insulating film having a film thickness of several nanometers. For the purpose, a research has been conducted to develop a method for forming a silicon nitride film by nitriding silicon directly.

As such a method for forming a silicon nitride film on a silicon substrate by introducing nitrogen into the silicon substrate directly, there has been proposed a method of heating the silicon substrate in a processing chamber filled with an ammonia gas and irradiating ultraviolet rays (see, for example, Reference 2). Further, though a method of directly nitriding the silicon substrate by forming a plasma of the ammonia gas with a parallel plate type plasma processing apparatus is also disclosed in Reference 2, there occurs a problem in such case that a damage of the silicon substrate is caused due to a very high energy of the plasma or a quality of the silicon nitride film deteriorates due to an unexpected reaction. Thus, Reference 2 proposes the nitirding method using the ultraviolet rays without using the plasma as a way to avoid the aforementioned problems that are caused when the silicon substrate is nitrided by the plasma.

Reference 1: Japanese Patent Laid-open Application No. 2001-274148 (Claims, etc.)

Reference 2: Japanese Patent Laid-open Application No. 2003-243387 (Claims, Paragraphs [0018]~[0015], and FIG. 8)

As pointed out in Reference 2, when a nitride film is formed by directly nitriding silicon by the plasma, there may be incurred a so-called plasma damage that the quality of the nitride film deteriorates due to an implantation of high-energy ions into the film. This plasma damage would have an adverse influence upon characteristics of a device, e.g., a transistor, resulting in deterioration of device performance.

Further, when the silicon is plasma-nitrided directly, there is a problem that an N concentration decreases (N is lost from the film) or oxidation readily occurs with a lapse of time. In particular, as the thickness of the nitride film decreases, the possibility of the film quality deterioration due to the N loss or the oxidation increases. Thus, a formation of a stable nitride film becomes difficult.

SUMMARY OF THE INVENTION

In view of the above, the present invention provides a technique for forming a thin nitride film featuring a high quality by directly nitriding silicon by means of a plasma.

In accordance with a first aspect of the present invention, there is provided a substrate nitriding method for nitriding a target substrate by allowing a nitrogen-containing plasma to act on silicon on a surface of the substrate in a processing chamber of a plasma processing apparatus, wherein the nitridation by the nitrogen-containing plasma is performed by controlling a sheath voltage $V_{dc}$ around the substrate, which is a potential difference $V_p-V_f$ between a plasma potential $V_p$ in a plasma generating region and a floating potential $V_f$ of the substrate, to be less than or equal to about 3.5 eV.

Preferably, the sheath voltage $V_{dc}$ is controlled to be about 0 to 2 eV.

Preferably, the nitrogen-containing plasma is generated by introducing a microwave into the processing chamber via a planar antenna member having a plurality of slots.

Preferably, a dielectric plate having a plurality of through holes is disposed between the plasma generating region and the target substrate in the plasma processing chamber. In this case, it is preferable that diameters of the through holes are set to range from about 2.5 to 10 mm, and in a region of the dielectric plate corresponding to the substrate, a ratio of a total opening area of the through holes to an area of the substrate is set to be about 10 to 50%. Preferably, a processing pressure is about 1.33 Pa to 1333 Pa, and, more preferably, about 66.7 Pa to 266.6 Pa.

Preferably, a processing pressure is about 93.3 Pa to 1333 Pa.

Preferably, a processing temperature is about 600° C. to 900° C. Further, a silicon nitride film is formed on the surface of the substrate by the nitridation and a thickness of the silicon nitride film may be about 1 to 5 nm.

In accordance with a second aspect of the present invention, there is provided an insulating film forming method for forming a silicon nitride film on a surface of a substrate where silicon is exposed by nitriding the silicon directly by means of exposing the surface of the substrate to a nitrogen-containing plasma, wherein the silicon nitride film is formed on the surface of the substrate by nitriding the silicon by controlling a sheath voltage $V_{dc}$ around the substrate, which is a potential difference $V_p-V_f$ between a plasma potential $V_p$ of the nitrogen-containing plasma and a floating potential $V_f$ of the substrate, to be less than or equal to about 3.5 eV.

Preferably, the nitrogen-containing plasma is a plasma of a gaseous mixture of a rare gas and a nitrogen gas.

Preferably, the sheath voltage $V_{dc}$ is controlled to be about 0 to 2 eV.

Preferably, the nitrogen-containing plasma is generated by a microwave propagated via a planar antenna member having a plurality of slots.

Preferably, the nitrogen-containing plasma is formed above a dielectric plate having a plurality of through holes and moves down to below the dielectric plate through the through holes to thereby reach the surface of the substrate. In this case, it is preferable that a region of the dielectric plate corresponding to the substrate, a ratio of a total opening area of the through holes to an area of the substrate is set to be about 10 to 50%. Further, a processing pressure for forming the nitrogen-containing plasma may be about 1.33 Pa to 1333 Pa. Preferably, an electron temperature of the nitrogen-containing plasma formed above the dielectric plate is about 0.7 to 2 eV, and, more preferably, less than or equal to about 1.5 eV. Further, preferably, an electron temperature of the nitrogen-containing plasma moved down to below the dielectric plate is less than or equal to about 1 eV, and, more preferably, less than or equal to about 0.7 eV.

Preferably, a processing temperature is about 600° C. to 900° C.

In accordance with a third aspect of the present invention, there is provided a computer executable control program that controls, when executed, a plasma processing apparatus to perform a substrate nitriding method for nitriding silicon on a surface of a substrate in a processing chamber of the plasma processing apparatus by using a nitrogen-containing plasma, by controlling a sheath voltage $V_{dc}$ around the substrate, which is a potential difference $V_p-V_f$ between a plasma potential $V_p$ in a plasma generating region and a floating potential $V_f$ of the substrate, to be less than or equal to about 3.5 eV.

In accordance with a fourth aspect of the present invention, there is provided a computer readable storage medium for storing therein a computer executable control program, wherein the control program controls, when executed, a plasma processing apparatus to perform a substrate nitriding method for nitriding silicon on a surface of a substrate in a processing chamber of the plasma processing apparatus by using a nitrogen-containing plasma, by controlling a sheath voltage $V_{dc}$ around the substrate, which is a potential difference $V_p-V_f$ between a plasma potential $V_p$ in a plasma generating region and a floating potential $V_f$ of the substrate, to be less than or equal to about 3.5 eV.

In accordance with a fifth aspect of the present invention, there is provided a plasma processing apparatus including:

a plasma supply source for generating a nitrogen-containing plasma;

a vacuum evacuable processing vessel accommodating a substrate supporting table for mounting a target substrate thereon; and a control unit for controlling a substrate nitriding method to be carried out, the method being for nitriding silicon on a surface of the substrate in the processing vessel of the plasma processing apparatus by using the nitrogen-containing plasma, by controlling a sheath voltage $V_{dc}$ around the substrate, which is a potential difference $V_p-V_f$ between a plasma potential $V_p$ in a plasma generating region and a floating potential $V_f$ of the substrate, to be less than or equal to about 3.5 eV.

In accordance with the present invention, the silicon is directly nitrided using the nitrogen-containing plasma by controlling the sheath voltage $V_{dc}$ to be less than or equal to about 3.5 eV, thus suppressing a plasma damage and forming a thin silicon nitride film having high-quality.

That is, in the silicon nitride film obtained by the method of the present invention, even when the film thickness is less than, e.g., 5 nm, the N loss or oxidation hardly takes place, thus stably maintaining the N concentration to be high. The method of the present invention, by which such stable nitride film can be formed, can be preferably employed in a manufacturing process of semiconductor devices being miniaturized for the purpose of forming a thin gate insulating film having a thickness of, e.g., about 1 to 5 nm (preferably, about 1 to 2 nm), and the like.

By controlling the sheath voltage $V_{dc}$ to be in a range from 0 to 2 eV, the N concentration of the silicon nitride film can be further increased and the film quality can be further improved.

Further, by forming the nitrogen-containing plasma by introducing the microwave into the processing chamber via the planar antenna member having a plurality of slots, the electron temperature and the ion energy of the plasma can be further decreased, and hence, the plasma damage on the substrate can be decreased further.

Moreover, by disposing the dielectric plate having a plurality of through holes between the plasma generating region and the target substrate in the processing chamber, the control of the sheath voltage $V_{dc}$ can be performed readily. In this case, by setting the processing pressure to be in a range from 6.8 Pa to 1333 Pa and the processing temperature to be in a range from 600 to 900° C. as well as using the dielectric plate, the sheath voltage $V_{dc}$ can be more readily adjusted to a desired value. That is, by combining the hardware configuration of the plasma processing apparatus and the process conditions, the sheath voltage $V_{dc}$ can be controlled more delicately and also more readily.

DETAILED DESCRIPTION OF THE EMBODIMENTS

Figure 1:
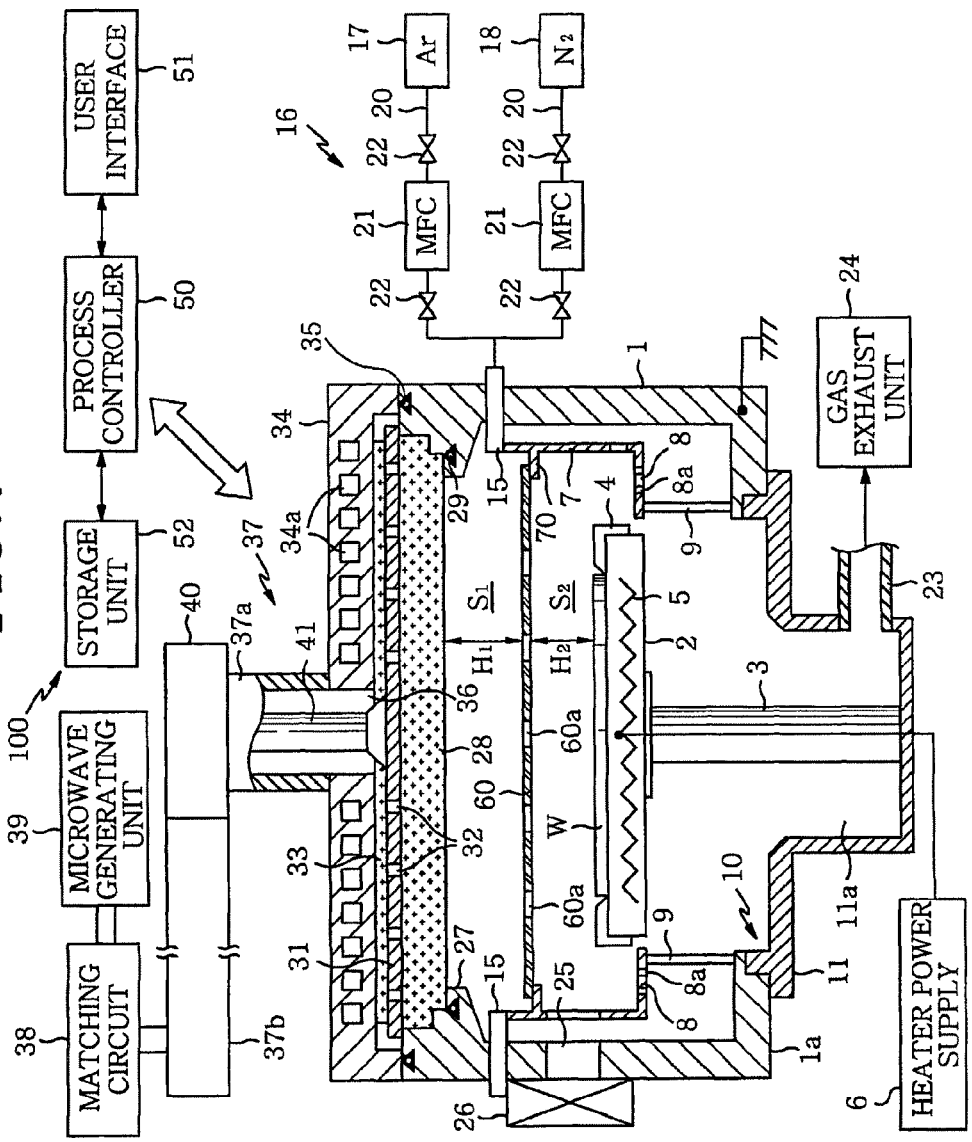
FIG. 1 is a schematic cross sectional view of an exemplary plasma processing apparatus which is applicable to the present invention.

Hereinafter, embodiments of the present invention will be described in detail with reference to the accompanying drawings. FIG. 1 is a cross sectional view schematically showing an exemplary plasma processing apparatus which is preferably applicable to the present invention. The plasma processing apparatus 100 is configured as an RLSA (Radial Line Slot Antenna) microwave plasma processing apparatus capable of generating a high-density microwave plasma having a low electron temperature by way of generating the plasma while introducing a microwave into a processing chamber via a planar antenna having a plurality of slots, especially, an RLSA antenna. With this plasma processing apparatus 100, a desired process can be performed by a plasma having a density of about $1 \times 10^{10}$ to $5 \times 10^{10}/cm^3$ and an electron temperature of about 0.7 to 2 eV.

Therefore, this plasma processing apparatus 100 can be preferably employed in a manufacturing process of various semiconductor devices such as an MOS (Metal Oxide Semiconductor) transistor, a MOSFET (Metal Oxide Semiconductor Field Effect Transistor), and the like, for the purpose of forming gate insulating films and the like.

The plasma processing apparatus 100 includes a substantially cylindrical chamber 1 which is airtightly sealed and grounded. A circular opening 10 is provided at a substantially central portion of a bottom wall 1a of the chamber 1, and a gas exhaust chamber 11 communicating with the opening 10 is provided at the bottom wall 1a in a manner that it protrudes downward.

A mounting table 2 made of ceramic, e.g., AlN, is disposed in the chamber 1 to horizontally support thereon a Si wafer (hereinafter, simply referred to as a "wafer") W, which is a substrate to be processed. The mounting table 2 is supported by a cylindrical supporting member 3 made of ceramic, e.g., AlN, and extending upward from a central bottom portion of the gas exhaust chamber 11. A guide ring 4 for guiding the wafer W is disposed on the outer periphery portion of the mounting table 2.

Further, a resistance heater 5 is embedded in the mounting table 2 to heat the mounting table 2 by a power supplied from a heater power supply 6, and the wafer W to be processed is heated by the heated mounting table 2. Here, the temperature of the wafer W can be controlled in a range from, e.g., a room temperature to about 800° C. Further, a cylindrical liner 7 made of quartz is provided on an inner periphery of the chamber 1. Moreover, a baffle plate 8 provided with a number of gas exhaust holes 8a is annularly provided at an outer peripheral side of the mounting table 2 to evacuate the chamber 1 uniformly. The baffle plate 8 is supported by a plurality of supporting columns 9.

The mounting table 2 is provided with wafer supporting pins (not shown) which serve to support the wafer W, while moving up and down the wafer W, wherein the wafer supporting pins are configured to be protrusible above and retractable below the surface of the mounting table 2.

Disposed above the mounting table 2 is a plate 60 which serves to reduce a $V_{dc}$ between the plate 60 and the wafer W by attenuating ion energy in the plasma. The plate 60 is made of a ceramic dielectric such as quartz, sapphire, SiN, SiC, $Al_2O_3$, AlN and the like, polysilicon, silicon, or the like. To prevent metal contamination, quartz, SiN, polysilicon or silicon is preferable. The plate 60 is held in place by being engaged with a supporting portion 70 protruded inward from the liner 7 in the chamber 1 along the entire circumference thereof. Installation of the plate 60 is also possible in other ways.

It is preferable to install the plate 60 close to the wafer W. The distance (height $H_2$) between the plate 60 and the wafer W is preferably set to be e.g., about 3 to 50 mm and, more preferably, about 25 to 35 mm. In such case, the distance (height $H_1$) between the top surface of the plate 60 and the bottom surface of a transmission plate 28 (to be described later) is preferably set to be, e.g., about 30 to 150 mm and, more preferably, about 50 to 100 mm. By disposing the plate 60 at such position, it becomes possible to nitride the silicon uniformly while preventing a plasma damage from occurring.

With respect to the plate 60, a first plasma region $S_1$ is formed above the plate 60, and a second plasma region $S_2$ is formed below the plate 60. The volume of the second plasma region $S_2$ is preferably set to be equal to or smaller than the volume of the first plasma region $S_1$. A ratio ($H_1/H_2$) of the height $H_1$ of the first plasma region $S_1$ to the height $H_2$ of the second plasma region $S_2$ is preferably set to be, e.g., about 0.6 to 50 and, more preferably, about 1.4 to 4.

Figure 2A:
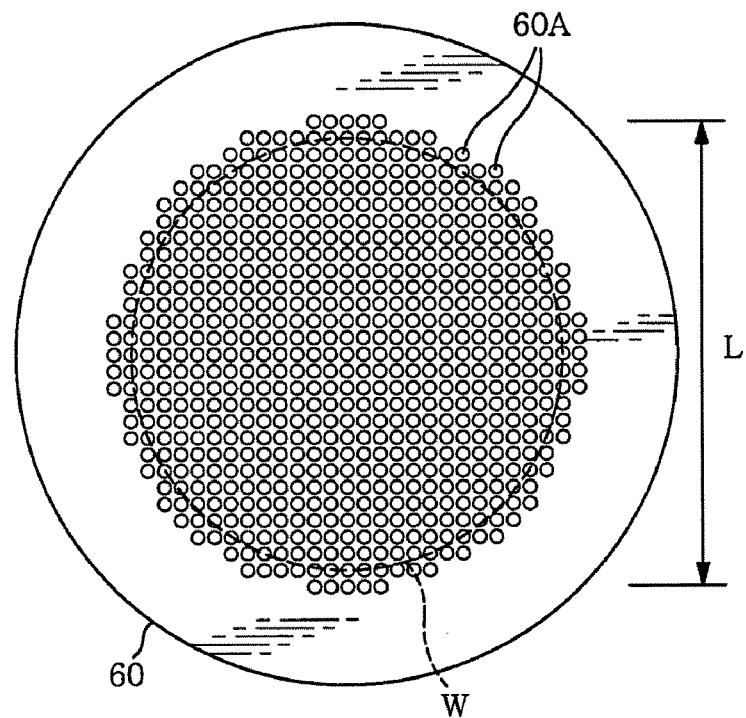
FIG. 2A sets forth a plan view of a plate.
Figure 2B:
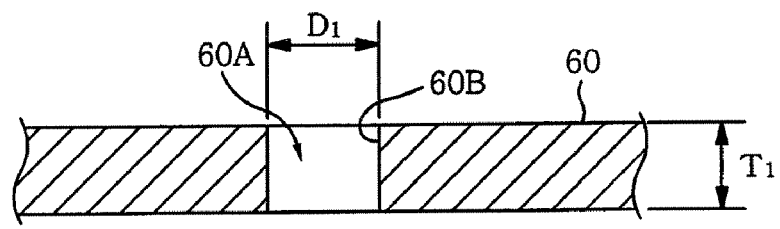
FIG. 2B provides a cross sectional view showing major parts of the plate.

The plate 60 is provided with a number of through holes 60a. FIGS. 2A and 2B show detailed configuration of the plate 60. FIG. 2A provides a top view of the plate 60, while FIG. 2B presents a cross sectional view showing major parts of the plate 60.

The through holes 60a of the plate 60 are arranged in a substantially uniform manner such that their arrangement area is slightly larger than a wafer mounting area indicated by a dashed line of FIG. 2A. To be specific, as for a wafer W having a diameter of 300 mm in FIG. 2A, for example, the through holes 60a are arranged such that a length L corresponding to a diameter of a circle forming the outer periphery of the arrangement area of the through holes 60a extends more outward than the outer periphery of the wafer W by a pitch of the through holes 60a, e.g., about 5 to 30 mm. Further, it is also possible to arrange the through holes 60a over the entire surface of the plate 60. As described, by arranging the through holes 60a such that their arrangement area is larger than the area of the wafer W, a uniform nitriding process can be performed.

A diameter $D_1$ of each through hole 60a can be set arbitrarily. For example, the diameter $D_1$ is preferably set to be, e.g., about 2 to 15 mm and, more preferably, about 2.5 to 10 mm. FIG. 2A shows an example where the diameter $D_1$ is 10 mm. The sizes of the through holes 60a can be varied depending on their positions on the plate 60. Further, the through holes 60a can be arranged in various shapes: for example, they can be arranged in, e.g., a concentric, a radial or a spiral shape. Moreover, a thickness $T_1$ of the plate 60 is preferably about 2 to 20 mm and, more preferably, about 2 to 5 mm. By setting the diameters of the through holes 60a as described, the voltage $V_{dc}$ and an ion damage on the wafer W can be reduced, whereby a uniform nitriding process is enabled.

The plate 60 functions as an ion energy attenuating unit for reducing the total amount of the ion energy.

That is, by disposing the dielectric plate 60, it becomes possible to allow radicals in the plasma to pass through the plate 60, while blocking most of ions in the plasma. For this purpose, the opening area of the through holes 60a of the plate 60, the thickness $T_1$ of the plate 60 (the height of a wall 60b), the installation position of the plate 60 (the distance from the wafer W), and the like need to be considered together as will be described below. For example, in the region of the plate 60 corresponding to the wafer W (i.e., in the region of the plate 60 overlapped with the wafer W), if the diameter of the through holes 60a is set to be 2.5 to 10 mm, a ratio of the total opening area of the through holes 60a to the area of the wafer W is preferably set to range from about 10 to 50%. By controlling the ratio of the opening area, the ion energy can be reduced and the nitriding process can be performed in a low $V_{dc}$ state.

An annular gas introducing member 15 is provided in a sidewall of the chamber 1, and a gas supply system 16 is connected to the gas introducing member 15. The gas introducing member 15 may be disposed in a shower shape. The gas supply system 16 includes, for example, an Ar gas supply source 17 and an $N_2$ gas supply source 18, and these gases are supplied to the gas introducing member 15 through respective gas lines 20 to be introduced into the chamber 1 through the gas introducing member 15. Each of the gas lines 20 is provided with a mass flow controller 21 and opening/closing valves 22 disposed at an upstream and a downstream side of the mass flow controller 21. Further, instead of the $N_2$ gas, an $NH_3$ gas, a gaseous mixture of $N_2$ and $H_2$, hydrazine, or the like can be used as a nitrogen-containing gas. Furthermore, a rare gas such as Kr, Xe, He or the like can be used instead of the Ar gas.

A gas exhaust line 23 is connected to a side surface of the gas exhaust chamber 11, and a gas exhaust unit 24 having a high speed vacuum pump is connected to the gas exhaust line 23. By operating the gas exhaust unit 24, a gas in the chamber 1 is uniformly discharged into a space 11a of the gas exhaust chamber 11 to be exhausted outside through the gas exhaust line 23. Accordingly, the inside of the chamber 1 can be depressurized to a specific vacuum level, e.g., about 0.133 Pa, at a high speed.

At the sidewall of the chamber 1, there are provided a loading/unloading port 25 through which the wafer W is transferred between the chamber 1 and a transfer chamber (not shown) disposed adjacent to the plasma processing apparatus 100; and a gate valve 26 for opening and closing the loading/unloading port 25.

The chamber 1 has an opening at its top, and a ring-shaped support 27 is protrudently provided along the circumference of the opening. A microwave transmitting plate 28 made of a dielectric material, e.g., quartz or ceramic such as $Al_2O_3$, AlN, or the like, is airtightly disposed on the support 27 via a seal member 29 to allow microwave to pass therethrough. Accordingly, the inside of the chamber 1 is hermetically kept.

Figure 3:
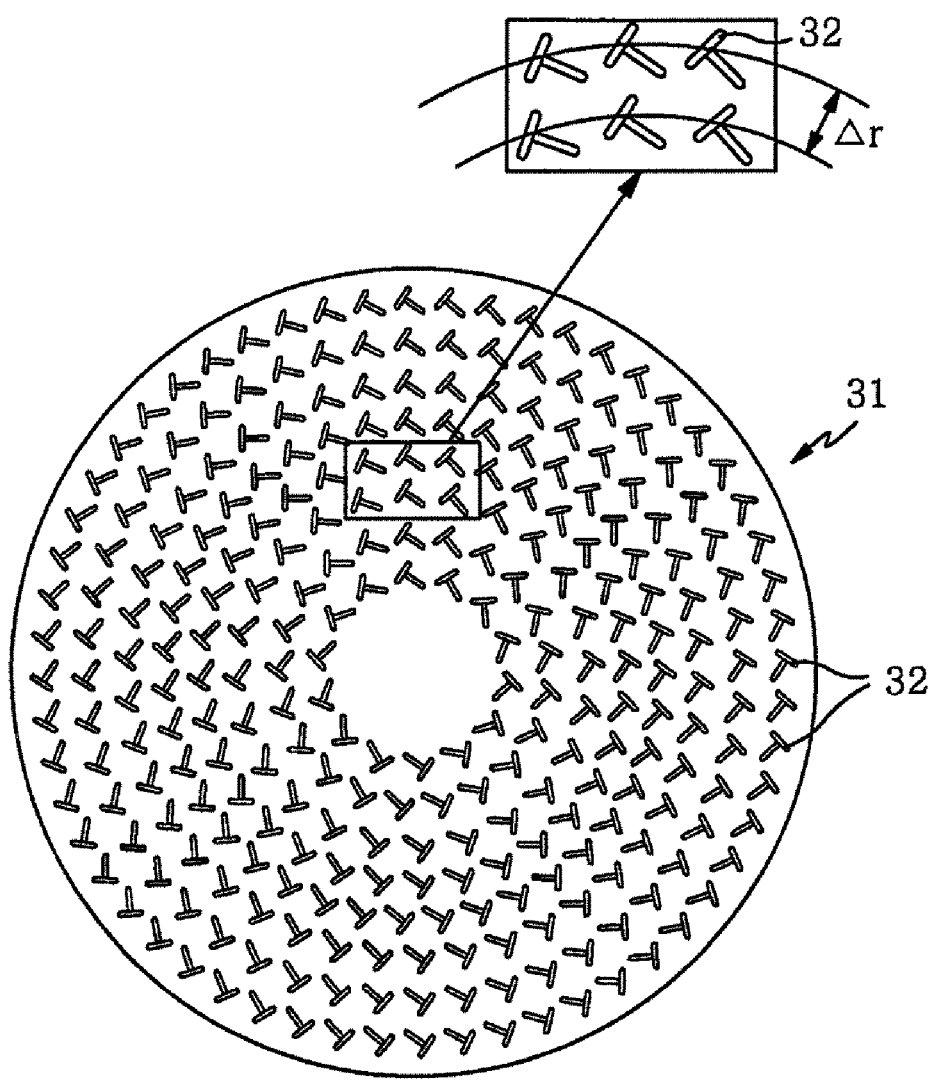
FIG. 3 presents a plan view of a planar antenna member.

A circular plate-shaped planar antenna member 31 is provided on the transmitting plate 28 to face the mounting table 2. The planar antenna member 31 is held by a top end of the sidewall of the chamber 1. The planar antenna member 31 is made of aluminum or copper plate plated with gold or silver, and it is provided with a plurality of slot-shaped microwave radiation holes 32 formed therethrough in a certain pattern. Each hole 32 is formed in, e.g., an elongated slit shape as shown in FIG. 3, and, typically, every two neighboring holes 32 are arranged in a T-shape, as shown in FIG. 3. These holes 32 are concentrically arranged. The length of each hole 32 and an arrangement interval between the holes 32 are determined depending on a wavelength $\lambda_g$ of the microwave. For example, the holes 32 are disposed at an interval of $\lambda_g/4$, $\lambda_g/2$ or $\lambda_g$. In FIG. 3, a radial interval between the adjacent holes 32 concentrically arranged is defined as $\Delta r$. Further, each hole 32 may have another shape such as a circular shape, an arc shape and the like, and the arrangement pattern of the holes 32 is not limited to the concentric circular pattern exemplified herein but they may be arranged in, e.g., a spiral shape, a radial shape or the like.

On a top surface of the planar antenna member 31, there is disposed a retardation member 33 formed of a dielectric material having a dielectric constant greater than that of a vacuum. The wavelength of a microwave is long under vacuum, and the retardation member 33 functions to shorten the wavelength of the microwave to thereby control the plasma. Further, the planar antenna member 31 and the transmitting plate 28 may be configured to be either in contact with each other or distanced apart from each other, and so are the retardation member 33 and the planar antenna member 31.

On a top surface of the chamber 1, a shield cover 34 made of a metal material, e.g., aluminum, stainless steel or the like, is provided to cover the planar antenna member 31 and the retardation member 33. A seal member 35 seals a gap between the top surface of the chamber 1 and the shield cover 34. Further, a cooling water path 34a is formed in the shield cover 34. By flowing cooling water through the cooling water path 34a, the shield cover 34, the retardation member 33, the planar antenna member 31, and the transmitting plate 28 are cooled. The shield cover 34 is grounded.

The shield cover 34 has an opening 36 in a center of its top wall, and a waveguide 37 is connected to the opening 36. A microwave generating device 39 is connected to an end portion of the waveguide 37 via a matching circuit 38, whereby a microwave having a frequency of, e.g., about 2.45 GHz generated from the microwave generating device 39 is allowed to propagate to the planar antenna member 31 through the waveguide 37. Here, a microwave having a frequency of about 8.35 GHz or about 1.98 GHz can also be used.

The waveguide 37 includes a coaxial waveguide 37a having a circular cross section and extending upward from the opening 36 of the shield cover 34; and a horizontally extending rectangular waveguide 37b connected to an upper end of the coaxial waveguide 37a via a mode transducer 40. The mode transducer 40 disposed between the rectangular waveguide 37b and the coaxial waveguide 37a functions to convert a TE mode of a microwave propagated through the rectangular waveguide 37b into a TEM mode. Further, an internal conductor 41 extends in the center of the coaxial waveguide 37a, and a lower end of the internal conductor 41 is fixedly connected to the center of the planar antenna member 31. In this configuration, the microwave is allowed to uniformly propagate to the planar antenna member 31 in a radial manner via the internal conductor 41.

Each component of the plasma processing apparatus 100 is connected to and controlled by a process controller 50 having a CPU. A user interface 51 is connected to the process controller 50, wherein the user interface 51 includes, e.g., a keyboard for a process manager to input a command to operate the plasma processing apparatus 100, a display for showing an operational status of the plasma processing apparatus 100, and the like.

Moreover, connected to the process controller 50 is a storage unit 52 for storing therein recipes including control programs (software) to be used in realizing various processes, which are performed in the plasma processing apparatus 100 under the control of the process controller 50, process condition data, and the like.

When a command is received through the user interface 51, the process controller 50 retrieves and executes a necessary recipe from the storage unit 52, and a desired process is performed in the plasma processing apparatus 100 under the control of the process controller 50. The recipes including the control programs, process condition data, and the like can be stored in a computer readable storage medium such as a CD-ROM, a hard disk, a flexible disk, a flash memory, or the like. Alternatively, the recipes can be used in an online manner by being transmitted, when needed, from another apparatus via, e.g., a dedicated line.

The RLSA type plasma processing apparatus 100 can perform, e.g., a silicon nitride film forming process by directly nitriding a silicon layer on a wafer W in the following sequences.

First, the gate value 26 is opened, and a wafer W having a silicon layer formed thereon is loaded into the chamber 1 through the loading/unloading port 25 and is mounted on the mounting table 2. Then, an Ar gas and a $N_2$ gas are supplied from the Ar gas supply source 17 and the $N_2$ gas supply source 18 of the gas supply system 16 into the chamber 1 via the gas introducing member 15 at predetermined flow rates.

Specifically, the flow rate of the rare gas such as Ar is set to range from about 250 to 2000 mL/min (sccm), and the flow rate of the $N_2$ gas is set to range from about 10 to 100 mL/min (sccm). The internal pressure of the chamber 1 is regulated to be a processing pressure in the range of about 1.33 to 1333 Pa (10 mTorr to 10 Torr): preferably, about 26.6 to 400 Pa (200 mTorr to 3 Torr), more preferably, at about 66.7 to 266.6 Pa (500 mTorr to 2 Torr). The wafer w is heated up to about 300 to 900° C.: preferably, about 600 to 900° C. and, more preferably, about 600 to 800° C.

Further, when the plate 60 is not installed, it is preferable to set the processing pressure to be in the range from about 93.3 to 1333 Pa (700 mTorr to 10 Torr).

Afterward, the microwave from the microwave generating device 39 is conducted to the waveguide 37 via the matching circuit 38 and then allowed to propagate through the rectangular waveguide 37b, the mode transducer 40 and the coaxial waveguide 37a in that order. Then, the microwave is supplied to the planar antenna member 31 via the internal conductor 41 and is then emitted to a space above the wafer W in the chamber 1 from the holes 32 of the planar antenna member 31 via the transmitting plate 28. The microwave propagates in the TE mode within the rectangular waveguide 37b. Then, the TE mode of the microwave is converted into the TEM mode by the mode transducer 40, and the microwave in the TEM mode propagates toward the planar antenna member 31 through the coaxial waveguide 37a. Due to the microwave emitted from the planar antenna member 31 into the chamber 1 through the microwave transmitting plate 28, an electromagnetic field is generated in the chamber 1, whereby the Ar gas and the $N_2$ gas are converted into plasma. Specifically, the emission of the microwave through the plurality of holes 32 of the planar antenna member 31 causes the microwave plasma to have a high density of about $1\times10^{10}$ to $5\times10^{12}/cm^3{}_1$, and also to have a low electron temperature lower than or equal to about 1.5 eV near the wafer W.

Though the microwave plasma thus generated inflicts less plasma damage by ions or the like on a base film, the plasma damage is further reduced by disposing the dielectric plate 60 in the chamber 1 as described above. That is, the plate 60 separates the first plasma region $S_1$ where the plasma is generated and the second plasma region $S_2$ where the wafer W is processed by the plasma that has passed through the plate 60, whereby the ion energy of the second plasma region $S_2$ is greatly attenuated, and a sheath voltage $V_{dc}$ near the wafer W can be reduced, and the electron temperature of the plasma can be reduced less than or equal to 1 eV and, more preferably, less than 0.7 eV. As a result, the plasma damage can be further reduced. Moreover, nitrogen N is directly introduced into the silicon by the action of active species in the plasma, especially by the action of nitrogen radicals N* or the like, so that a uniform SiN film can be formed.

Figure 4A:
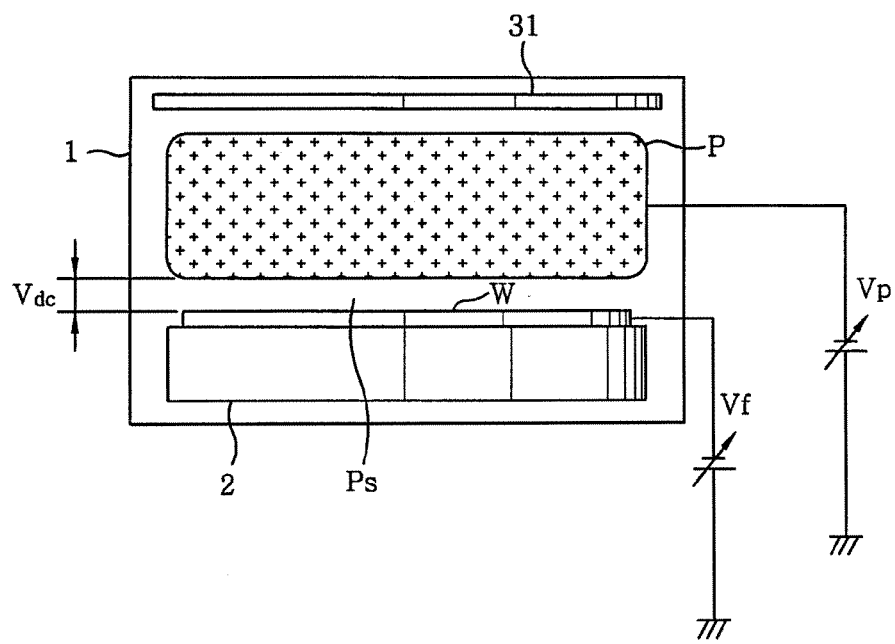
FIG. 4A depicts a schematic diagram to describe a $V_{dc}$ in a plasma processing apparatus.

Now, effects of the present invention will be explained with reference to FIGS. 4A and 4B. Referring to FIG. 4A, in the plasma processing apparatus, a plasma P, which is generated by the action of the electromagnetic field formed by the microwave supplied from the planar antenna member 31 upon the gaseous mixture of the $Ar/N_2$ gases, moves downward in the space within the chamber 1 toward the wafer W mounted on the mounting table 2.

As shown in FIG. 4A, if a plasma potential (spatial potential) of the plasma P is $V_p$, and a floating potential of the wall of the grounded chamber 1 or the mounting table 2 is $V_f$, a potential (sheath voltage $V_{dc}$) at an interface layer (sheath) Ps between the plasma P and the chamber wall or the mounting table 2 is defined as $V_{dc}=V_p-V_f$. The $V_{dc}$ has a correlation with the magnitude of the ion energy of the plasma. If the $V_{dc}$ increases, the ion energy introduced into silicon (in an insulating film to be formed) increases (that is, the velocity of the ions is accelerated) as well, and the total amount of the ion energy also increases.

The supply of the energy (e.g., energy from electrons, ions, radicals, and the like) from the plasma P to the wafer W being processed is essential in carrying out nitridation of silicon. For example, in case of nitriding a silicon oxide film, an energy (as a total energy amount including the ion energy) greater than 4.3 eV, which is a binding energy for Si—O binding, is supplied to break the Si—O binding, thereby enabling the nitridation of the silicon. Since, however, the binding energy for the Si—N binding is about 3.5 eV, there is a likelihood that the Si—N binding may be broken if the supplied energy is greater than 3.5 eV. Besides, if an unnecessarily high energy is supplied, a plasma damage might be inflicted on the silicon itself, resulting in generation of defects.

In contrast, a binding energy for Si—Si binding is about 2.3 eV which is smaller than the binding energy for the Si—O binding. Thus, if the silicon is directly nitrided, the nitridation can be carried out with a smaller energy in comparison with the case of nitriding the silicon oxide film, so that the ion energy can be reduced as well.

Further, if an energy much greater than the binding energy for the Si—Si binding is supplied when nitriding the silicon directly, the probability of the generation of crystalline defects and the like increases.

Thus, in accordance with the present invention, in a plasma process for forming a silicon nitride film by nitriding silicon (polycrystalline or single crystalline silicon) directly by the plasma, the $V_{dc}$ is reduced less than or equal to 3.4 eV by using a means for reducing the $V_{dc}$ (e.g., the plate 60 provided with the open through holes 60a), whereby stable nitrogen concentration can be maintained, without causing a damage on the film, and a silicon nitride film having a stable Si—N binding can be formed.

Figure 4B:
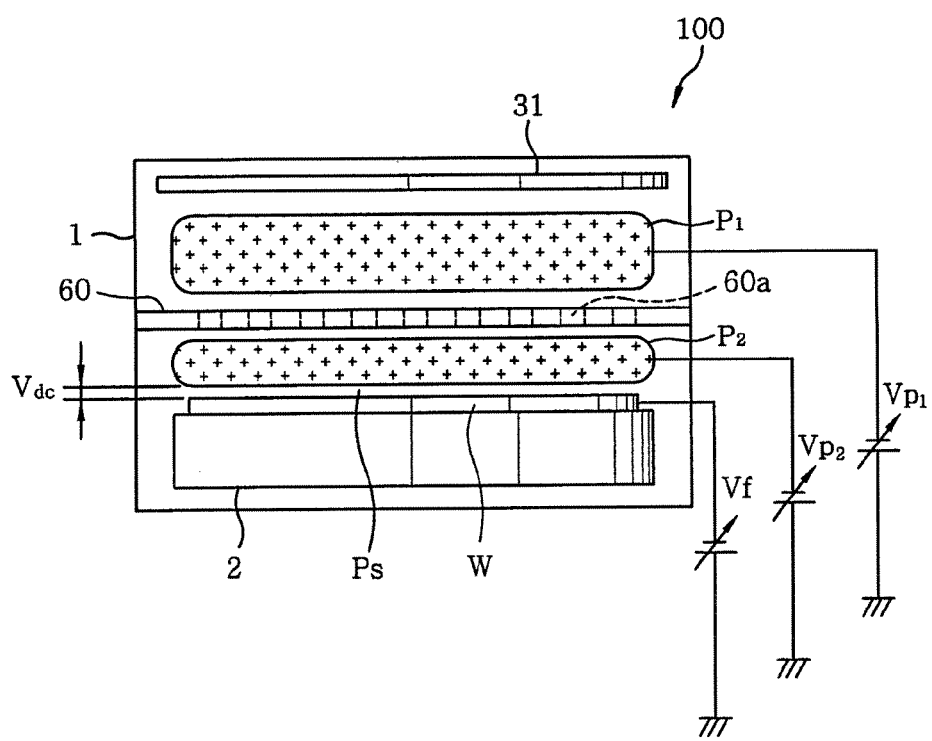
FIG. 4B offers a schematic diagram to describe a $V_{dc}$ in a plasma processing apparatus equipped with the plate.

The plasma processing apparatus 100 of FIG. 1 includes the plate 60 having the through holes 60a as a means for reducing the ion energy, as shown in FIG. 4B. Accordingly, ions in the plasma, which are moving down toward the wafer W, are attenuated or extinguished. In particular, though argon ions ($Ar^+$) and the like contained in the plasma are charged particles having a great energy, they are attenuated or deactivated while they are passing through the plate 60 made of a dielectric material such as quartz. This means that the ion energy can be controlled by the plate 60 when the ions pass through it.

As a result, a potential $V_{p2}$ of a plasma $P_2$ below the plate 60 is reduced smaller than a potential $V_{p1}$ of a plasma $P_1$ above the plate 60 ($V_{p2}<V_{p1}$). A $V_{dc}$ near the wafer W defined as $V_{p2}-V_f$ becomes smaller than that measured in the case where the plate 60 is not disposed (as shown in FIG. 4A). Further, since the plasma process is performed without causing the ions or the radicals, which have passed through the through holes 60a, to be accelerated excessively, a mild nitriding process can be performed.

As described, by attenuating the ion energy of the plasma though the use of the plate 60 made of the dielectric material, the $V_{dc}$ can be reduced and regulated at a desired value.

Figure 5A:
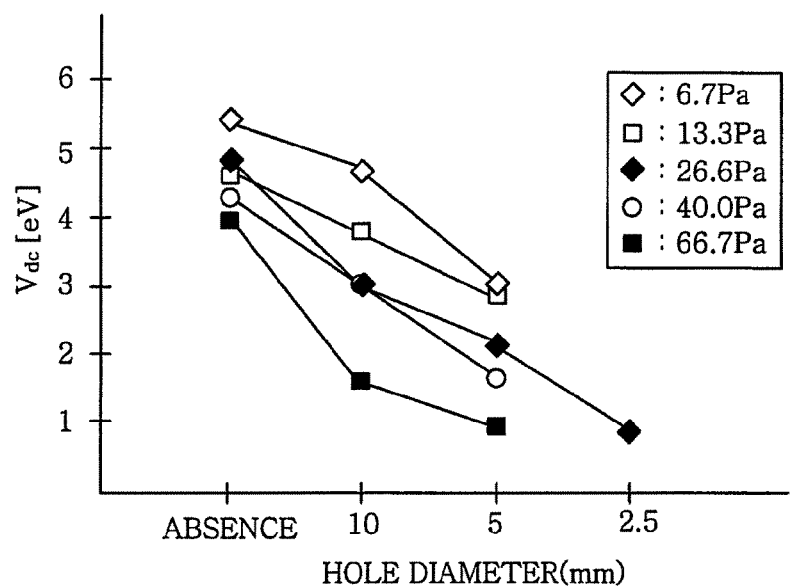
FIG. 5A is a graph showing basic data of a $V_{dc}$ and a relationship between a hole diameter of the plate and the $V_{dc}$.

Now, experiment data for investigating a relationship between a diameter of the through holes 60a of the plate 60, a $V_{dc}$ and a processing pressure will be explained with reference to FIGS. 5A and 5B. FIG. 5A shows an experiment result of a relationship between the diameter of the through holes 60a of the plate 60 and the $V_{dc}$, which is obtained while varying the processing pressure in the plasma processing apparatus 100 having the same configuration as that described in FIG. 1. A vertical axis of the graph of FIG. 5A represents the $V_{dc}$, while a horizontal axis thereof represents the diameter of the through holes 60a (in the graph, "ABSENCE" represents a case in which the plate 60 is not used).

Here, the through holes 60a were uniformly arranged to face the surface of the wafer W. Further, when the diameter of the through holes 60a was Φ10 mm, an opening area ratio (i.e., a ratio of the total opening area of the through holes 60a to the area of the wafer W in the region of the plate 60 corresponding to the wafer w) was set to be 48%; when the diameter of the through holes 60a was Φ5 mm, the opening area ratio was set to be about 28%; and when the diameter of the through holes 60a was Φ2.5 mm, the opening area ratio was set to be 13%.

In the experiment, a wafer W cleaned with 1% dilute hydrofluoric acid (DHF) solution was used. As process conditions for the plasma process, a processing gas of $Ar/N_2$ was used at a flow rate of 1000/40 mL/min (sccm); a wafer temperature was set to be a room temperature; a processing pressure was varied from 6.7 Pa (50 mTorr) to 13.3 Pa (100 mTorr), 26.6 Pa (200 mTorr), 40.0 Pa (300 mTorr) and 66.7 Pa (500 mTorr), respectively; a power level supplied to the plasma was set to be 1.5 kW; and a processing time was 60 seconds. The $V_{dc}$ was acquired from a current-voltage measurement obtained by using a Langmuir probe.

As confirmed from FIG. 5A, the $V_{dc}$ can be reduced by providing the plate 60, in comparison with the case without using the plate 60 (the case of "ABSENCE"). Further, the $V_{dc}$ reducing effect varies depending on the diameter (opening area ratio) of the through holes 60a of the plate 60. At a same pressure level, the $V_{dc}$ reducing effect is found to improve as the hole diameter (opening area ratio) increases. The reason of the reduction of the $V_{dc}$ with the decrease of the pressure is deemed to be due to the fact that the ratio of radicals in the plasma increases as the pressure increases, whereas the ratio of ions in the plasma is high at a low pressure. Thus, it is preferable to set up a high pressure condition for the purpose of reducing the $V_{dc}$.

As confirmed from the above result, the plate 60 can be used as a means for reducing the $V_{dc}$ between the plate 60 and the wafer W in the plasma processing apparatus 100, thus reducing the ion energy. Further, it is also revealed that the $V_{dc}$ can be regulated at a desired level by controlling a hardware configuration such as the diameter of the through holes 60a of the plate 60 or the opening area ratio or by varying a combination of the hardware configuration and the processing pressure.

Figure 5B:
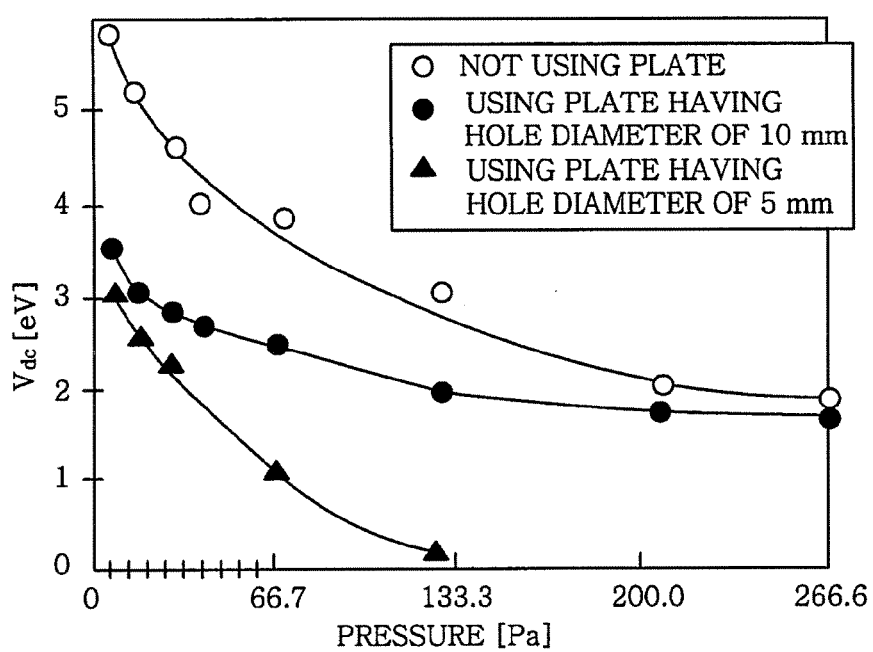
FIG. 5B is a graph showing basic data of a $V_{dc}$ and a relationship between a processing pressure and the $V_{dc}$.

FIG. 5B shows a variation of the $V_{dc}$ obtained while the pressure is increased up to 266.6 Pa. In this example, after a plasma process was performed under the same processing conditions as those of the example of FIG. 5A, the $V_{dc}$ was measured. It is preferable to control the $V_{dc}$ less than or equal to about 3.5 eV and, more preferably, less than or equal to about 2 eV. FIG. 5B reveals that in case the diameter of the through holes 60a of the plate 60 is 10 mm, it is preferable to set the pressure to be high in order to reduce the $V_{dc}$. By increasing the pressure up to 133.3 Pa, the $V_{dc}$ can be reduced less than or equal to 2 eV.

The reason for this is deemed to be, as described above, due to the fact that the radical ratio in the plasma increases as the pressure increases, though the ion ratio in the plasma is high when the pressure is low. Accordingly, at a high pressure level, the effect of reducing the $V_{dc}$ through the use of the plate 60 is particularly conspicuous. Furthermore, FIGS. 5A and 5B also reveal that the $V_{dc}$ is lower when the diameter of the through holes 60a is smaller.

Then, by using the plasma processing apparatus 100, a silicon nitride film was formed by nitriding a Si substrate directly, and an N concentration and an O concentration in the silicon nitride film were measured by an XPS (X-ray Photoelectron Spectroscopy) method after a lapse of a certain time period.

In this example, a wafer W cleaned with 1% DHF solution was used.

As plasma processing conditions for the nitriding process, a processing gas of $Ar/N_2$ was used at a flow rate of 1000/40 mL/min (sccm); a wafer temperature was set to be 800° C.; a processing pressure was set to be in the range of 6.7 Pa to 266.6 Pa (50 to 2000 mTorr); a power level supplied to the plasma was set to be 1.5 kW; and a processing was set to be 10 to 60 seconds.

In this example, the through holes 60a of the plate 60 were uniformly arranged to correspond to the mounting area of the wafer W: in case of Φ10 mm, 626 through holes were arranged and in case of Φ2.5 mm, 2701 through holes were arranged. Further, in the region of the plate 60 corresponding to the wafer W, the ratio of the total opening area ratio of the through holes 60a to the area of the wafer W was set to be about 48% in case of Φ10 mm and about 14% in case of Φ2.5 mm. Moreover, for comparison, there were also measured an N concentration and an O concentration of a film formed by performing a nitriding process without using the plate 60.

Figure 6A:
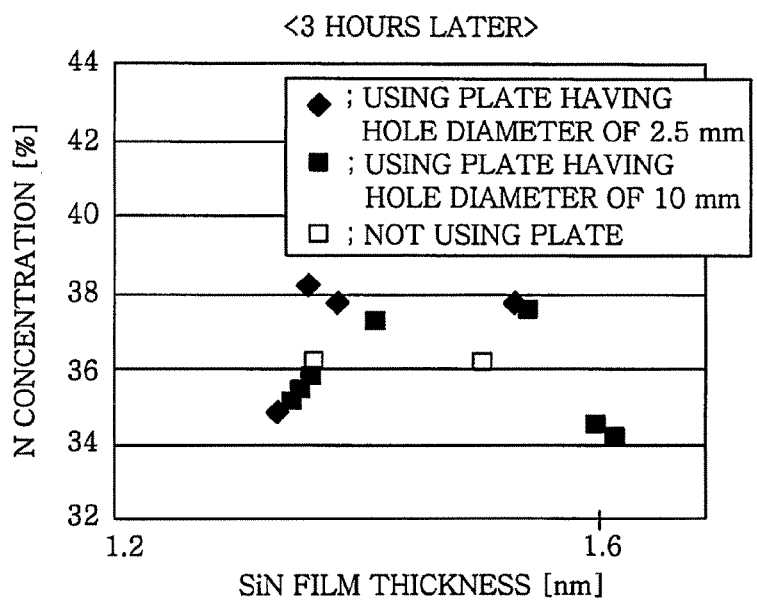
FIG. 6A presents a graph showing an XPS (X-ray Photoelectron Spectroscopy) analysis result of a relationship between an N concentration and a thickness of a SiN film at an exposure time of 3 hours.
Figure 6B:
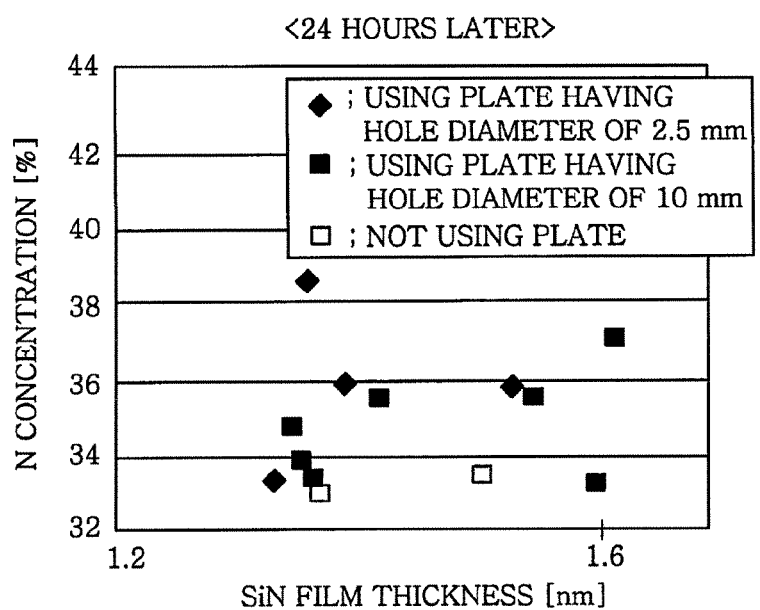
FIG. 6B provides a graph showing an XPS analysis result of a relationship between an N concentration and a thickness of an SiN film at an exposure time of 24 hours.
Figure 7:
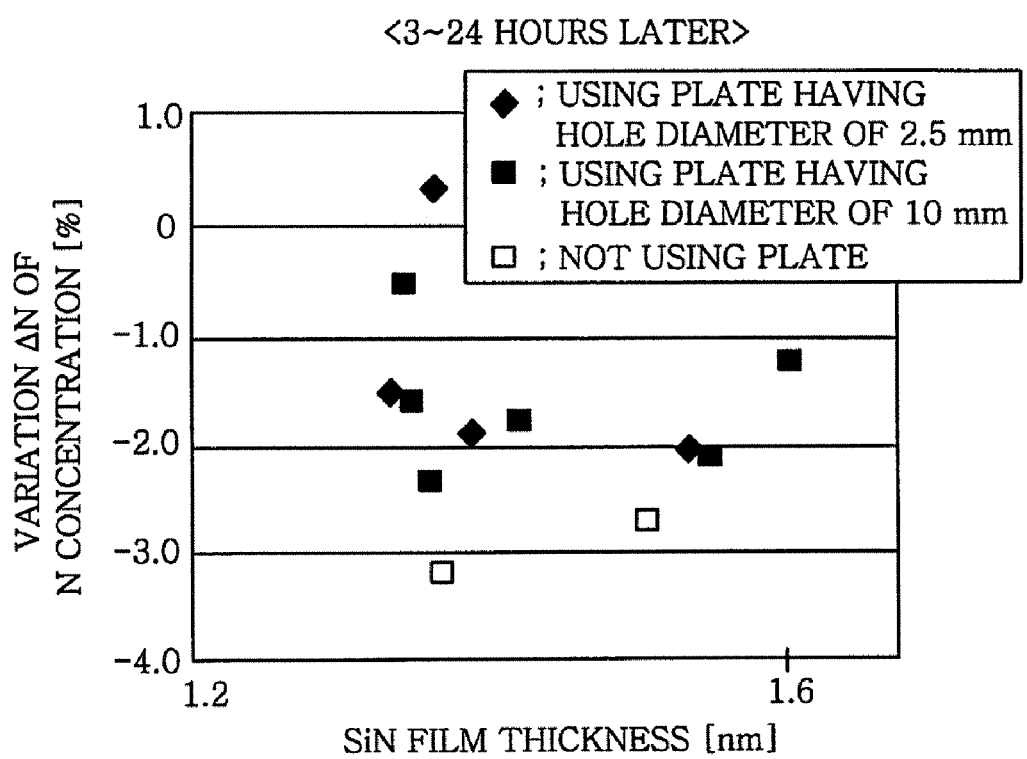
FIG. 7 is a graph showing an XPS analysis result of a relationship between a variation of an N concentration and a thickness of a SiN film during an exposure time between 3 and 24 hours.

FIG. 6A shows a relationship between an N concentration and a film thickness after a nitride film was exposed to the atmosphere for 3 hours after it was formed, and FIG. 6B shows a relationship between the N concentration and the film thickness after the nitride film was exposed to the atmosphere for 24 hours. FIG. 7 shows a relationship, which was obtained from the data of FIGS. 6A and 6B, between a variation ΔN of the N concentration and the film thickness during an exposure time (Q time) between 3 and 24 hours.

Figure 8A:
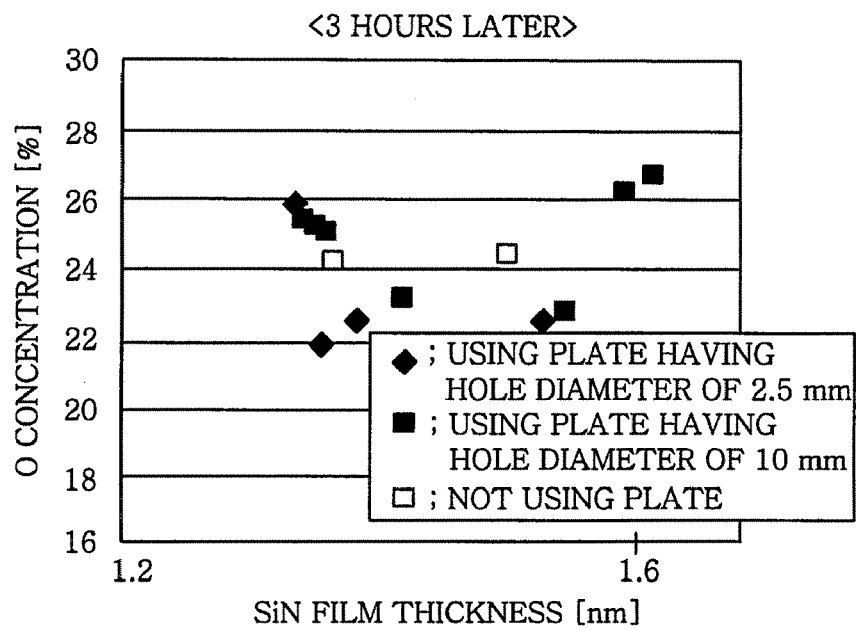
FIG. 8A depicts a graph showing an XPS analysis result of a relationship between an O concentration and a thickness of a SiN film at an exposure time of 3 hours.
Figure 8B:
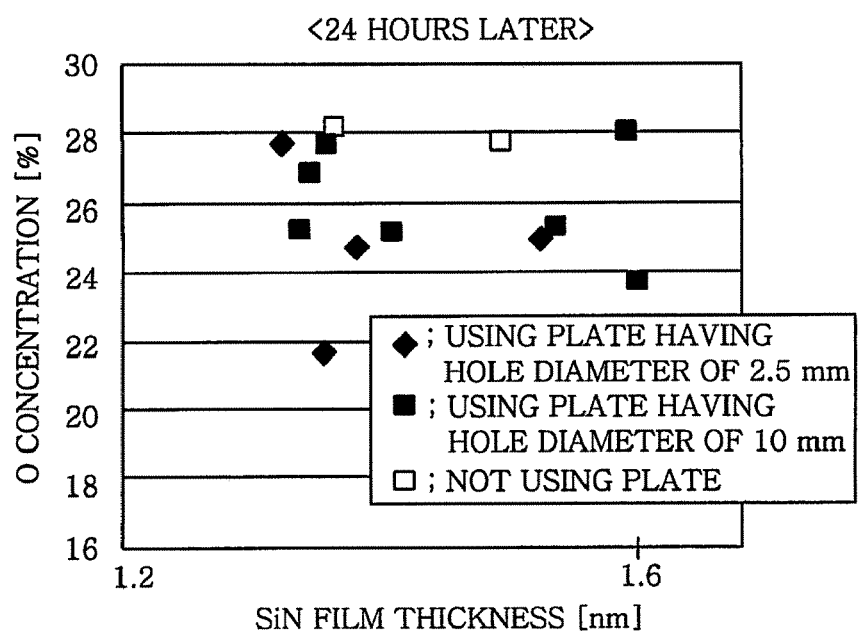
FIG. 8B presents a graph showing an XPS analysis result of a relationship between an O concentration and a thickness of a SiN film at an exposure time of 24 hours.
Figure 9:
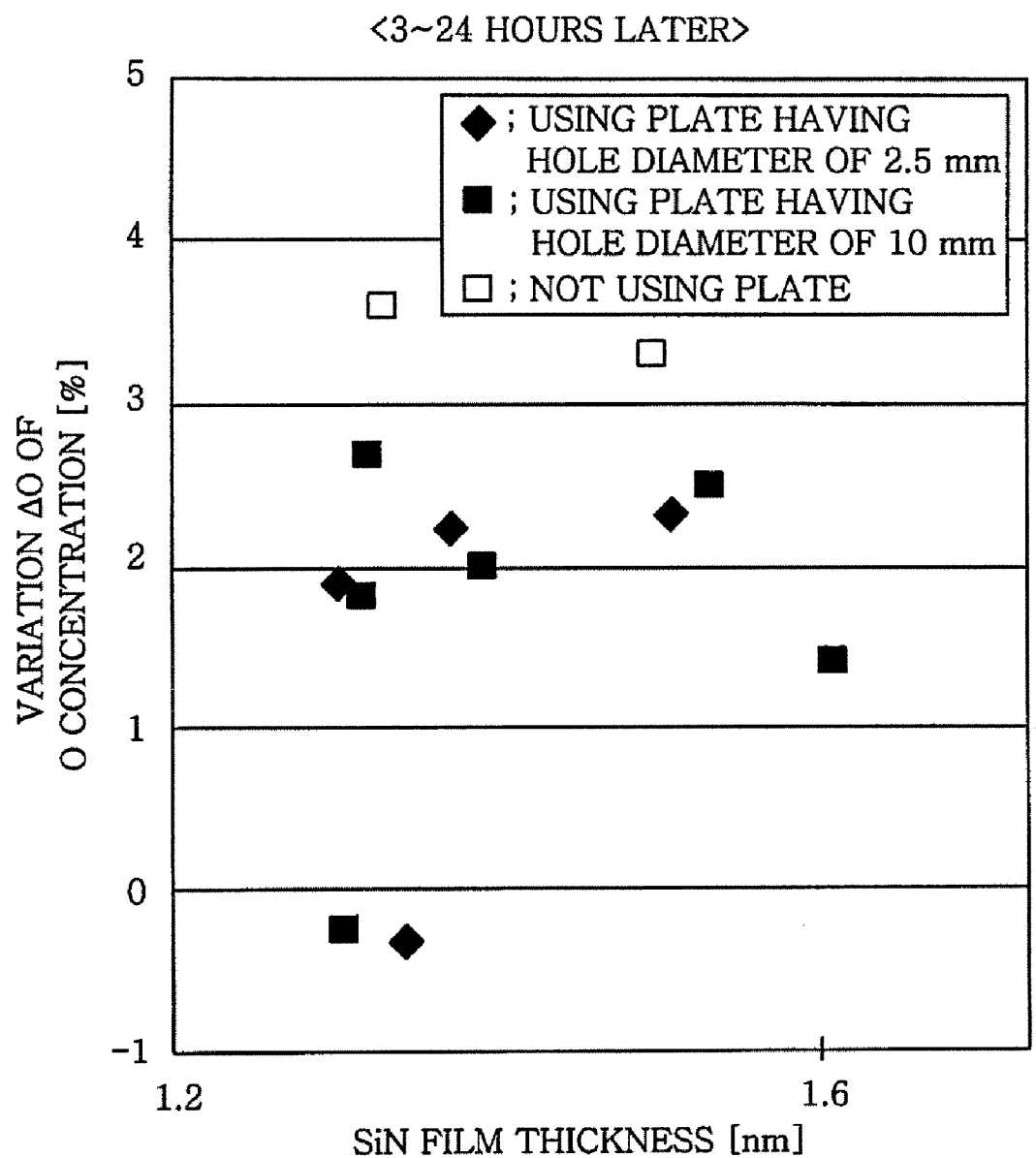
FIG. 9 provides a graph showing an XPS analysis result of a relationship between a variation of an O concentration and a thickness of a SiN film during an exposure time between 3 and 24 hours.

Further, FIG. 8A shows an O concentration after the nitride film was exposed to the atmosphere for 3 hours after it was formed, and FIG. 8B shows an O concentration after the nitride film was exposed to the atmosphere for 24 hours. FIG. 9 shows a relationship, which was obtained from the data of FIGS. 8A and 8B, between a variation ΔO of the O concentration and the film thickness during an exposure time (Q time) between 3 and 24 hours.

From FIG. 7, the N concentration in the nitride film tends to be maintained high in case the plate 60 is installed, in comparison with the case where the plate 60 is not used. That is, it is found that the variation ΔN of the N concentration during the exposure time between 3 and 24 hours is close to zero and suppressed to be smaller when using the plate 60, in comparison with the case the plate 60 is not used. From the comparison of FIGS. 6A and 6B, this tendency is conspicuous with the increase of the exposure time (Q time). Thus, it is confirmed that with the lapse of time, N is lost from the nitride film which was formed without installing the plate 60. The reason for this is deemed to be as follows. In case of the nitride film formed without using the plate 60, if the $V_{dc}$ is great, the nitride film is processed by a plasma having a great ion energy. Accordingly, previously formed Si—N binding is broken, and free N is formed in the nitride film, and with the lapse of time, the loss of N increases.

Meanwhile, in accordance with the present invention, since the nitridation is carried out in a reduced $V_{dc}$ by installing the plate 60, the Si—N binding is formed stably and the loss of N decreases, so that a stable nitride film can be formed. As described above, in the event that the amount of the ions in the plasma is large, the Si—N binding, which is formed by the nitridation of the silicon, would be broken by the ions having high energy, resulting in an increase of N loss from the silicon nitride film. On the contrary, in the event that the amount of the radicals in the plasma is large, the Si—N binding would not be broken by the radicals, resulting in a decrease of the N loss.

Further, as confirmed from FIG. 7 and FIGS. 6A and 6B, the N concentration is higher and N loss is fewer in case the diameter of the through holes 60a of the plate 60 is smaller. This is deemed to due to the fact that since the opening ratio of the through holes 60a with the diameter of 2.5 mm is smaller than that of the through holes 60a with the diameter of 10 mm, the decrement of the ion energy is greater, thus reducing the $V_{dc}$ near the wafer W more (see FIG. 5A). Accordingly, it is possible to suppress a generation of plasma damage, a formation of, e.g., Si—Ar binding that would hinder the Si—N binding, or a break of Si—N binding.

Further, from FIG. 9, there is observed a tendency in which the O concentration in the nitride film is maintained lower when the plate 60 is installed than in case it is not. From the comparison of FIGS. 8A and 8B, this tendency is conspicuous with the increase of the exposure time (Q time). The reason for this is deemed to be as follows. As for the nitride film formed without installing the plate 60, since the $V_{dc}$ near the wafer W is high, a plasma damage is caused or a previously formed Si—N binding is broken due to a plasma having a high ion energy, resulting in a generation of defects in the film (e.g., Si—Si binding, Si—, or the like). As a result, O would be introduced into the film from the atmosphere with the lapse of time and oxidation would take place, resulting in an increase of the O concentration.

Meanwhile, in case the plate 60 is installed and the nitridation is performed by a plasma of which $V_{dc}$ near the wafer W is reduced, the acceleration of ions is reduced, so that the break of the Si—N binding is suppressed, and an N loss or a plasma damage is reduced. Accordingly, in-film defects are reduced, and a stable Si—N binding is obtained. As a result, oxidation hardly takes place, so that a stable nitride film is formed. Moreover, since the opening ratio of the through holes 60a with the diameter of 2.5 mm is smaller than that of the through holes 60a with the diameter of 10 mm, the decrement of the ion energy is greater, thus reducing the $V_{dc}$ near the wafer W more. Thus, a stable Si—N binding is obtained and oxidation hardly occurs, so that a stable high-quality nitride film having a low O concentration can be formed.

From the results of FIGS. 6A and 6B to 9, it is confirmed that by disposing the plate 60 made of the dielectric material in the processing vessel, the ion energy can be attenuated and the $V_{dc}$ near the wafer W can be reduced, whereby the stable and dense nitride film can be formed. Further, it is also confirmed that the film quality can be improved by controlling the $V_{dc}$ by way of adjusting the diameter of the through holes 60a provided in the plate 60.

A silicon nitride film ($Si_3N_4$) has a dielectric constant $\in$ of 7 to 8, and a silicon oxide film ($SiO_2$) has a dielectric constant $\in$ of 4. Since the dielectric constant of the silicon nitride film is about twice as high as that of the silicon oxide film, a film thickness of a to-be-formed insulating film can be reduced by using the silicon nitride film. Further, in accordance with the embodiment of the present invention, the quality of the silicon nitride film is high despite its thin thickness. Thus, the present invention is particularly useful in forming a thin film of a next-generation device, e.g., a gate insulating film having a film thickness less than or equal to about 5 nm, preferably less than or equal to about 2 nm.

In general, with the increase of the thickness of the silicon nitride film formed by a plasma nitriding process, a trap is formed in the nitride film due to an occurrence of an N loss or a generation of damage, because the silicon nitride film is exposed to a plasma having a high ion energy for a long period of time. As a result, oxygen is allowed to enter the nitride film more easily. In accordance with the present invention, however, it is possible to form a stable silicon nitride film suffering little N loss or damage even in case the silicon nitride film is formed to have a thick thickness.

Figure 10:
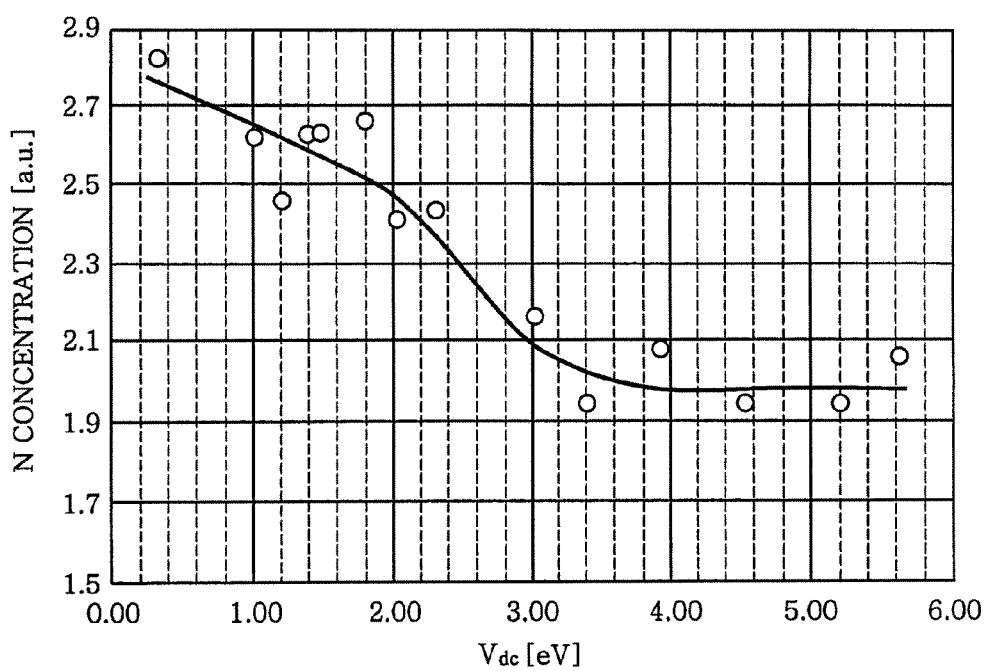
FIG. 10 offers a graph showing an XPS analysis result of a relationship between an N concentration of a SiN film and a $V_{dc}$.

FIG. 10 shows a relationship between a $V_{dc}$ and an N concentration of a nitride film in the plasma nitriding process. A vertical axis of FIG. 10 represents an N concentration normalized by a film thickness, while a horizontal axis thereof represents a $V_{dc}$. As process conditions, a processing gas of $Ar/N_2$ was used at a flow rate of 1000/40 mL/min (sccm); a wafer temperature was set to be 800° C.; a processing pressure was set to be 6.7 to 200 Pa (50 to 1500 mTorr); a power level supplied to the plasma was set to be 1.5 kW; and a processing time was set to be 10 to 60 seconds. The $V_{dc}$ was acquired from a current-voltage measurement obtained by using a Langmuir probe, and the N concentration was obtained by the XPS analysis. As seen from FIG. 10, by reducing the $V_{dc}$ of a target object to less than or equal to 3.5 eV, a stable and high N concentration can be obtained. Further, as revealed from FIG. 10, it is preferable to set the $V_{dc}$ of the target object of the plasma processing to be less than or equal to 3.5 eV and, more preferably, to be in a range of 0 to 2 eV in order to form a stable and dense nitride film which has a sufficient N concentration and hardly suffers an N loss and the like.

Now, a result of investigating effects of a temperature and a pressure in a nitriding process will be explained with reference to FIGS. 11 to 14.

In this example, by using the plasma processing apparatus 100, a nitride film was formed by nitriding a Si substrate directly, and a relationship between a nitride film forming rate (nitriding rate) and a processing temperature. Here, a wafer W cleaned with 1% DHF solution was used, and the wafer W has no oxide film. As process conditions of the nitriding process, a gaseous mixture of $Ar/N_2$ was used as a processing gas at a flow rate of 1000/40 mL/min (sccm); a wafer temperature was set to be 400° C. or 800° C.; a pressure was set to be 6.8 Pa or 266.6 Pa (50 mTorr or 2000 mTorr); a power level supplied to a plasma was set to be 1.5 kW; and a processing time was set to be 5 to 300 seconds. The result is provided in FIG. 11. Used in this example is a plate 60 provided with 626 through holes 60a each having a diameter of Φ10 mm and uniformly distributed to correspond to a mounting area of the wafer W, wherein, in the region of the plate 60 corresponding to the wafer W, a ratio of the total opening area of the through holes 60a to the area of the wafer W was about 48%.

Figure 11:
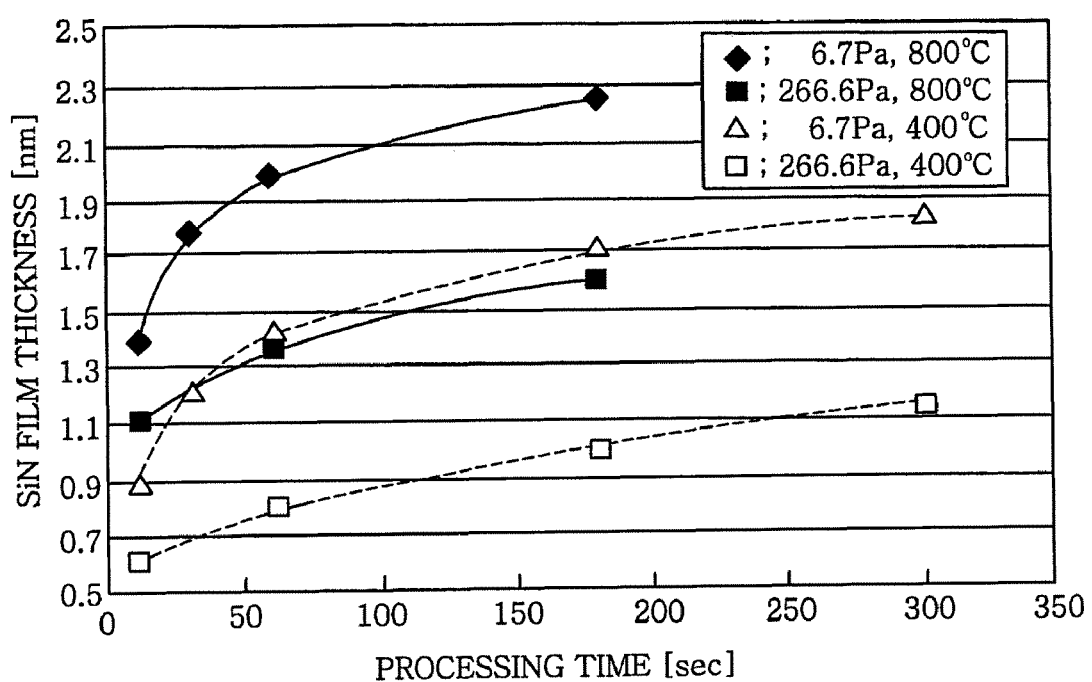
FIG. 11 is a graph showing a relationship between a nitriding process time and a SiN film thickness.

As can be seen from FIG. 11, by setting the processing temperature to be 400° C. to 800° C., it is possible to perform the nitriding process while controlling the nitriding rate. Further, the nitriding rate was higher when the nitriding process was performed at 800° C., and from this, it is revealed that a nitride film of a desired thickness can be formed within a shorter period of time at a higher temperature. Further, as for a pressure parameter, in comparison with 6.7 Pa and 266.6 Pa, the nitriding rate was higher under the lower pressure. It is because ion ratio is high at the low pressure, so that the nitridation is more readily carried out. As confirmed from the above results, by controlling the temperature, the pressure and the time of the nitriding process, it is possible to set the thickness of the nitride film to be in the range of, e.g., about 0.6 to 2.3 nm, as shown in FIG. 11.

Then, based on the above results, the effects of the temperature and the pressure upon the quality of the nitride film was investigated by way of measuring an N concentration and an O concentration of a nitride film by an XPS analysis.

Figure 12A:
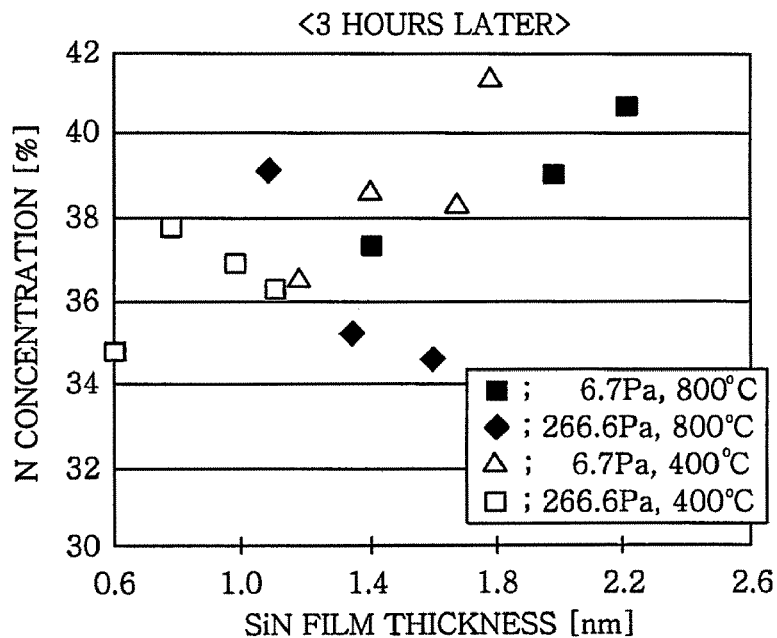
FIG. 12A provides an XPS analysis result of a relationship between an N concentration and a thickness of a SiN film at an exposure time of 3 hours.
Figure 12B:
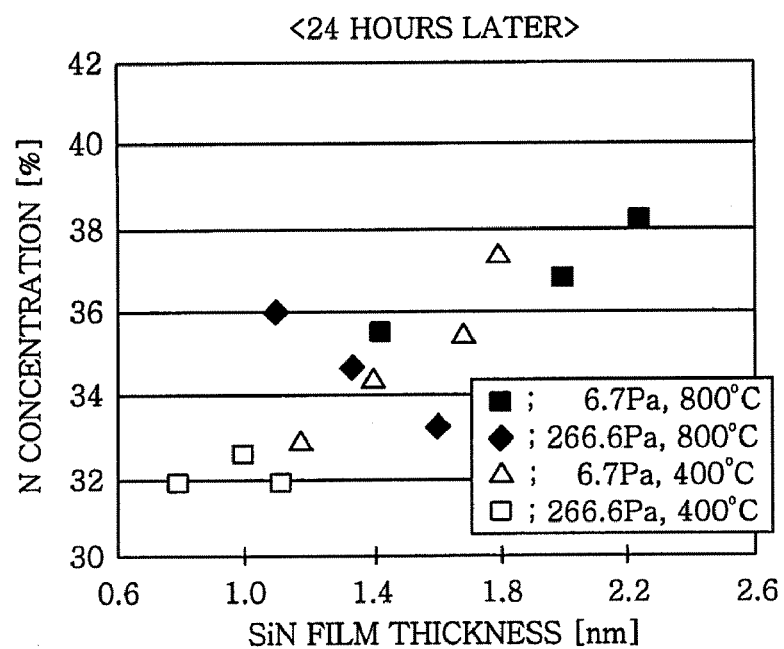
FIG. 12B presents an XPS analysis result of a relationship between an N concentration and a thickness of a SiN film at an exposure time of 24 hours.
Figure 13:
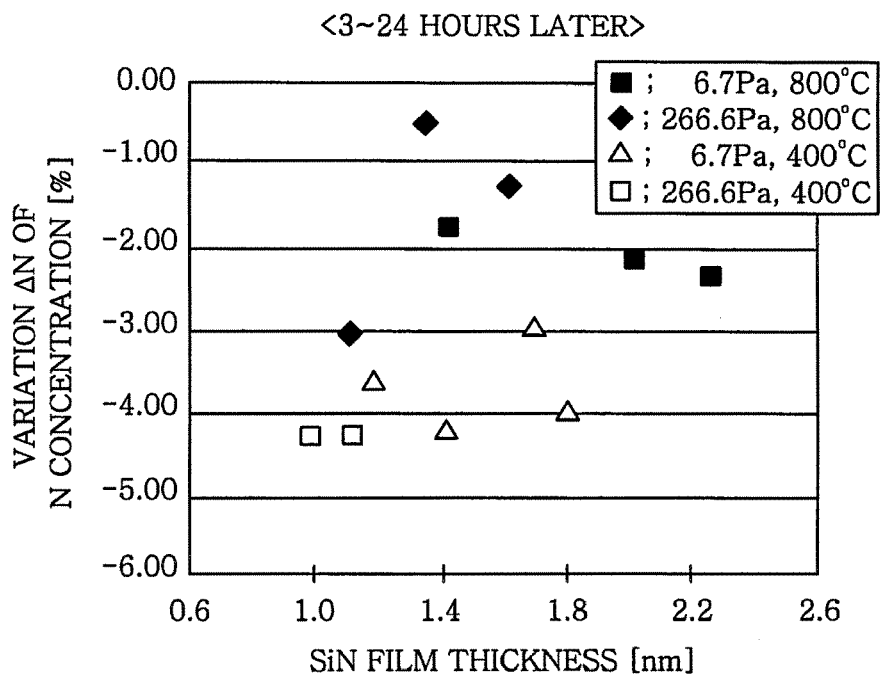
FIG. 13 offers a graph showing an XPS analysis result of a relationship between a variation of an N concentration and a thickness of a SiN film during an exposure time between 3 and 24 hours.

FIG. 12A shows a relationship between an N concentration and a film thickness of a nitride film after the nitride film was formed and exposed to the atmosphere for 3 hours; and FIG. 12B shows a relationship between the N concentration and the film thickness of the nitride film after the nitride film was exposed to the atmosphere for 24 hours. FIG. 13 describes a relationship between a variation ΔN of the N concentration and the film thickness of the nitride film during an exposure time (Q time) between 3 and 24 hours, which is obtained from the data of FIGS. 12A and 12B. Further, FIG. 14 describes a relationship between a variation ΔO of the O concentration and the film thickness of the nitride film during the exposure time (Q time) ranging from 3 to 24 hours.

As confirmed from FIG. 13, the variation ΔN of the N concentration is smaller and a stable nitride film can be obtained at the higher temperature of 800° C. As for the pressure condition, the variation ΔN of the N concentration was smaller and a stable nitride film can be obtained at the higher pressure of 266.6 Pa.

Figure 14:
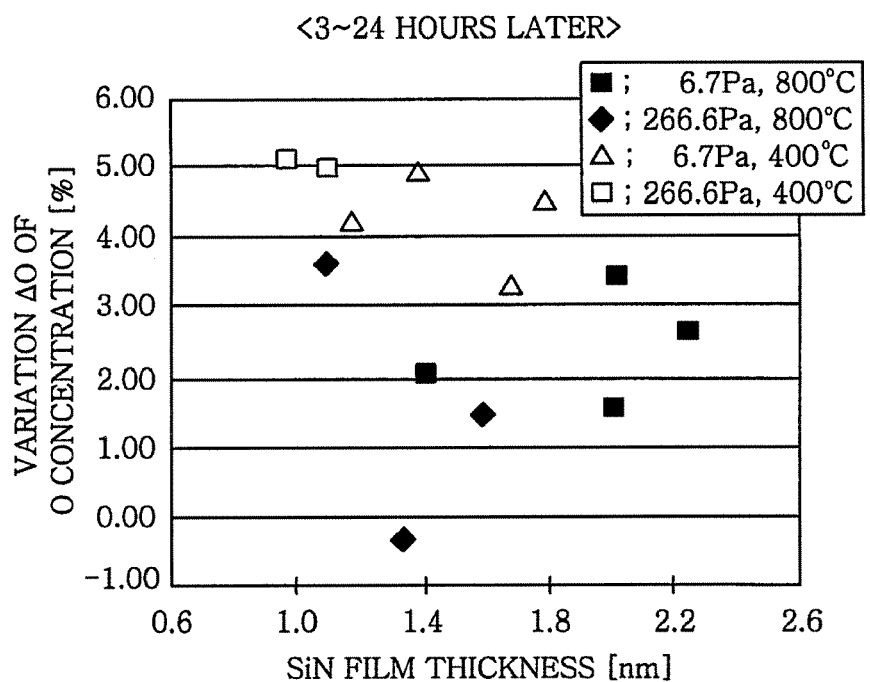
FIG. 14 depicts a graph showing an XPS analysis result of a relationship between a variation of an O concentration and a thickness of a SiN film during an exposure time between 3 and 24 hours.

Further, as revealed from FIG. 14, at the higher temperature of 800° C., the O concentration of the nitride film tends to be maintained low, and a stable nitride film is formed. Further, as for the pressure, the variation ΔO of the O concentration was smaller and a stable nitride film hardly oxidized is formed at the higher pressure of 266.6 Pa.

Thus, as revealed from the above results from FIGS. 12A and 12B to 14, when performing the nitriding process by using the plate 60 and the plasma whose $V_{dc}$ around the wafer W is suppressed, it is preferable to perform the process at a high temperature and a high pressure to form a stable nitride film which suffers little N loss and is not readily subject to oxidation. The processing temperature is preferably 600 to 900° C. and, more preferably, 600 to 800° C. Further, the processing pressure is preferably 26.6 Pa to 400 Pa and, more preferably, 66.7 Pa to 266.5 Pa.

Here, it is to be noted that the present invention is not limited to the embodiment described above but it can be modified in various ways.

For example, though the above embodiment has been described for the case of using the microwave plasma processing apparatus 100 which excites a plasma by a microwave of a frequency ranging from about 300 MHz to 300 GHz, it is also possible to use a high frequency plasma processing apparatus which excites a plasma by a high frequency wave of a frequency ranging from about 30 kHz to 300 MHz.

Moreover, though the RLSA plasma processing apparatus 100 is exemplified in FIG. 1, the present invention is application to various plasma processing apparatuses of, e.g., a remote plasma type, an ICP type, an ECR type, a surface reflection wave type, a CCP type, a magnetron type, or the like, as long as a plate made of a dielectric or a Si—based member is disposed in that apparatus.

Furthermore, through only one plate 60 was disposed in FIG. 1, two or more plates can be used together, if necessary. The opening area or the opening ratio of the through holes 60a can be appropriately adjusted depending on the type of a target object or process conditions of the plasma nitriding process.

The present invention has advantages when it is used in forming a silicon nitride film by nitriding silicon in the course of manufacturing various semiconductor devices.

While the invention has been shown and described with respect to the embodiments, it will be understood by those skilled in the art that various changes and modifications may be made without departing from the scope of the invention as defined in the following claims.

What is claimed is:

1. A plasma-nitriding method for directly nitriding a silicon layer exposed on a surface of a target substrate in a processing chamber of a plasma processing apparatus by using a nitrogen-containing plasma of a nitrogen-containing gas,
wherein the silicon layer is directly plasma-nitrided by the nitrogen-containing plasma by controlling a sheath voltage $V_{dc}$ around the substrate, which is a potential difference $V_p - V_f$ between a plasma potential $V_p$ in a plasma generating region of the nitrogen-containing plasma and a floating potential $V_f$ of the substrate, to be less than or equal to about 3.5 volts.

2. An insulating film forming method for forming a silicon nitride film by directly plasma-nitriding a silicon layer, the method comprising:
loading a substrate into a chamber, the substrate having a surface on which the silicon layer is exposed;
supplying a nitrogen-containing gas into the chamber;
generating a nitrogen-containing plasma of the nitrogen-containing gas; and
forming the silicon nitride film by directly plasma-nitriding the silicon layer by using the nitrogen-containing plasma,
wherein the silicon nitride film is formed by directly plasma-nitriding the silicon layer by controlling a sheath voltage $V_{dc}$ around the substrate, which is a potential difference $V_p - V_f$ between a plasma potential $V_p$ of the nitrogen-containing plasma and a floating potential $V_f$ of the substrate, to be less than or equal to about 3.5 volts.

3. A computer readable storage medium for storing therein a computer executable control program,
wherein the control program controls, when executed, a plasma processing apparatus to perform a plasma-nitriding method for directly nitriding a silicon layer exposed on a surface of a substrate in a processing chamber of the plasma processing apparatus by using a nitrogen-containing plasma, by controlling a sheath voltage $V_{dc}$ around the substrate, which is a potential difference $V_p - V_f$ between a plasma potential $V_p$ in a plasma generating region of the nitrogen-containing plasma and a floating potential $V_f$ of the substrate, to be less than or equal to about 3.5 volts.

4. A plasma processing apparatus comprising:
a vacuum evacuable processing vessel accommodating a substrate supporting table for mounting thereon a target substrate having a surface on which a silicon layer is exposed;
a gas introducing member through which a nitrogen-containing gas is introduced into the vessel;

a plasma supply source for generating a nitrogen-containing plasma of the nitrogen-containing gas in the vessel; and a control unit for controlling a plasma-nitriding method to be carried out, wherein the plasma-nitriding method includes:

introducing the nitrogen-containing gas into the vessel via the gas introducing member;

generating the nitrogen-containing plasma by the plasma supply source; and directly nitriding the silicon layer by using the nitrogen-containing plasma, by controlling a sheath voltage $V_{dc}$ around the substrate, which is a potential difference $V_p - V_f$ between a plasma potential $V_p$ in a plasma generating region of the nitrogen-containing plasma and a floating potential $V_f$ of the substrate, to be less than or equal to about 3.5 volts.

5. The plasma-nitriding method of claim 1, wherein the sheath voltage $V_{dc}$ is controlled to be about 0 to 2 volts.

6. The plasma-nitriding method of claim 1, wherein the nitrogen-containing plasma is generated by introducing a microwave into the processing chamber via a planar antenna member having a plurality of slots.

7. The plasma-nitriding method of claim 1, wherein a dielectric plate having a plurality of through holes is disposed between the plasma generating region and the target substrate in the plasma processing chamber.

8. The plasma-nitriding method of claim 7, wherein diameters of the through holes are set to range from about 2.5 to 10 mm, and in a region of the dielectric plate corresponding to the substrate, a ratio of a total opening area of the through holes to an area of the substrate is set to be about 10 to 50%.

9. The plasma-nitriding method of claim 7, wherein a processing pressure is about 1.33 Pa to 1333 Pa.

10. The plasma-nitriding method of claim 1, wherein a processing temperature is about 600° C. to 900° C.

11. The plasma-nitriding method of claim 1, wherein a silicon nitride film is formed on the surface of the substrate by the nitridation and a thickness of the silicon nitride film is about 1 to 5 nm.

12. The insulating film forming method of claim 2, wherein the nitrogen-containing plasma is a plasma of a gaseous mixture of a argon gas and a nitrogen gas.

13. The insulating film forming method of claim 2, wherein the sheath voltage $V_{dc}$ is controlled to be about 0 to 2 volts.

14. The insulating film forming method of claim 2, wherein the nitrogen-containing plasma is generated by a microwave propagated via a planar antenna member having a plurality of slots.

15. The insulating film forming method of claim 2, wherein the nitrogen-containing plasma is formed above a dielectric plate having a plurality of through holes and moves down to below the dielectric plate through the through holes to thereby reach the surface of the substrate.

16. The insulating film forming method of claim 15, wherein in a region of the dielectric plate corresponding to the substrate, a ratio of a total opening area of the through holes to an area of the substrate is set to be about 10 to 50%.

17. The insulating film forming method of claim 15, wherein a processing pressure for forming the nitrogen-containing plasma is about 1.33 Pa to 1333 Pa.

18. The insulating film forming method of claim 15, wherein an electron temperature of the nitrogen-containing plasma formed above the dielectric plate is about 0.7 to 2 eV.

19. The insulating film forming method of claim 2, wherein a processing temperature is about 600° C. to 900° C.

20. The plasma processing apparatus of claim 4, wherein in the vessel, a dielectric plate having a plurality of through holes for attenuating ion energy in the plasma is disposed above the supporting table.

21. The plasma processing apparatus of claim 4, wherein the plasma supply source is a microwave plasma source having a planar antenna member having a plurality of slots and introduces a microwave into the vessel via the planar antenna member.

22. The plasma processing apparatus of claim 4, wherein the plasma supply source is selected from a group including an inductively coupled plasma type, an electron cyclotron resonance type, a surface reflection wave type, a capacitively coupled plasma type and a magnetron type.

* * * * *